US012803545B2

(12) United States Patent
Spear et al.

(10) Patent No.: US 12,803,545 B2
(45) Date of Patent: Nov. 17, 2026

(54) DATA LINK LAYER LOW DENSITY SCRAMBLE PATTERN

(71) Applicant: International Business Machines Corporation, Armonk, NY (US)

(72) Inventors: Michael Spear, Round Rock, TX (US); Patrick James Meaney, Poughkeepsie, NY (US); Glen A. Wiedemeier, Austin, TX (US); Vikram B. Raj, Austin, TX (US); Ashutosh Mishra, Lagrangeville, NY (US); Rajat Rao, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 19/062,258

(22) Filed: Feb. 25, 2025

(65) Prior Publication Data

US 2026/0254445 A1 Aug. 27, 2026

(51) Int. Cl.
*H03K 3/01* (2006.01)
*H03K 3/037* (2006.01)
(Continued)

(52) U.S. Cl.
CPC ............... *H03K 5/135* (2013.01); *H03K 3/01* (2013.01); *H03K 3/037* (2013.01); *H03M 9/00* (2013.01)

(58) Field of Classification Search
CPC .......... H03K 3/01; H03K 3/037; H03K 5/135; H03M 9/00
(Continued)

(56) References Cited

U.S. PATENT DOCUMENTS

| | | |
|---|---|---|
| 7,805,535 B2 | 9/2010 | Narsinh et al. |
| 8,854,983 B2 | 10/2014 | Romero et al. |

(Continued)

FOREIGN PATENT DOCUMENTS

KR 10-2208497 B1 1/2021

OTHER PUBLICATIONS

Khan, et al., "A novel bus encoding scheme from energy and crosstalk efficiency perspective for AMBA based generic SoC systems", Proceedings of the 18th International Conference on VLSI Design held jointly with 4th International Conference on Embedded Systems Design (VLSID'05), Jan. 2005, 6 pgs.

(Continued)

*Primary Examiner* — William Hernandez
(74) *Attorney, Agent, or Firm* — Cantor Colburn LLP; Edward Wixted

(57) ABSTRACT

A data link includes a transmit side having a physical layer circuit including a serial pin interface and a data link circuit layer coupled by one or more parallel multi-bit data lanes to the physical layer circuit. The data link layer circuit transfers parallel data to the physical layer circuit responsive to a parallel clock signal. The data link layer circuit includes a pseudo-random bit sequence generator circuit configured to generate, based on the parallel clock signal, a pseudo-random bit sequence having a width of M bits, where M is greater than 1. The data link layer circuit further includes a hold circuit coupled to receive and hold the pseudo-random bit sequence for a selected number of cycles of the parallel (Continued)

clock signal determined by a hold signal and a timing circuit configured to assert the hold signal based on multiple cycles of the parallel clock signal.

18 Claims, 6 Drawing Sheets

(51) Int. Cl.
*H03K 5/135* (2006.01)
*H03M 9/00* (2006.01)

(58) Field of Classification Search
USPC .................................. 375/146, 371; 713/400
See application file for complete search history.

(56) References Cited

U.S. PATENT DOCUMENTS

| | | | |
|---|---|---|---|
| 9,455,895 | B2 | 9/2016 | Christenson et al. |
| 10,178,581 | B2 | 1/2019 | Tujkovic et al. |
| 10,423,567 | B2 | 9/2019 | Khan et al. |
| 11,683,204 | B2 | 6/2023 | Chen et al. |
| 11,693,465 | B2 | 7/2023 | Wang et al. |
| 11,777,770 | B1 * | 10/2023 | Levy .................. H04L 25/4904 375/261 |
| 12,019,577 | B2 | 6/2024 | Srivastava et al. |
| 12,113,612 | B2 | 10/2024 | Hu et al. |
| 2006/0093146 | A1 * | 5/2006 | Ungerboeck ..... H04L 25/03866 380/268 |
| 2009/0252326 | A1 | 10/2009 | Buchmann et al. |
| 2016/0285624 | A1 | 9/2016 | Wagh et al. |
| 2017/0222686 | A1 | 8/2017 | Khan et al. |
| 2024/0202140 | A1 | 6/2024 | Akavaram et al. |

OTHER PUBLICATIONS

Kim et al., “Length of Pseudorandom Binary Sequence Required to Train Artificial Neural Network Without Overfitting”, IEEE Access, Sep. 9, 2021, pp. 125358-125365.

Liu et al., “Physical layer encryption scheme based on cellular automata and DNA encoding by hyper-chaos in a CO-OFDM system”, Optics Express, Jun. 7, 2021, pp. 18976-18987.

Maragkoudaki et al., “Energy-Efficient Encoding for High-Speed Serial Interfaces”, IEEE Transactions on Very Large Scale Integration (VLSI) Systems , Oct. 2022, pp. 1484-1496.

Poojari et al., “FPGA implementation of random number generator using LFSR and scrambling algorithm for lightweight cryptography”, International Journal of Applied Science and Engineering, Dec. 2021, 9 pages.

Tang et al., “Security strategy of parallel bit interleaved FBMC/OQAM based on four-dimensional chaos”, Optics Express, Jul. 19, 2021, pp. 24561-24575.

Wang et al., “6b9b Encoding Scheme for Improving Single-Ended Interface Bandwidth and Reducing Power Consumption without Pin Count Increase”, 2007 IEEE Electrical Performance of Electronic Packaging, Oct. 2007, pp. 25-28.

Wang et al., “Bit-by-bit optical code scrambling technique for secure optical communication”, Optics Express, Feb. 8, 2011, pp. 3503-3512.

Anonymous, “PCI Express® Base Specification Revision 5.0 Version 1.0”, PCI-SIG, May 22, 2019, 1299 pages.

* cited by examiner

DATA LINK LAYER LOW DENSITY SCRAMBLE PATTERN

BACKGROUND OF THE INVENTION

The present invention relates generally to data processing and, in particular, to data link layer data scrambling.

A conventional multiprocessor (MP) computer system comprises multiple processing units (which can each include one or more processor cores and their various cache memories), input/output (I/O) devices, and data storage, all communicatively coupled by one or more data links (e.g., buses). Conventional MP computer systems typically scramble data patterns communicated over the serial data lines comprising the data links to achieve an approximate direct current (DC) balance over the data patterns, a more uniform randomness in the bit sequences, a balanced mix of switching frequencies, and a balanced running disparity (i.e., the difference between the number of 1s and 0s transmitted) on each serial data line.

BRIEF SUMMARY

According to one or more embodiments, a data link includes a transmit side having a physical layer circuit including a serial pin interface and a data link layer circuit coupled by one or more parallel multi-bit data lanes to the physical layer circuit. The data link layer circuit transfers parallel data to the physical layer circuit responsive to a parallel clock signal. The data link layer circuit includes a pseudo-random bit sequence generator circuit configured to generate, based on the parallel clock signal, a pseudo-random bit sequence having a width of M bits, where M is greater than 1. The data link layer circuit further includes a hold circuit coupled to receive and hold the pseudo-random bit sequence for a selected number of cycles of the parallel clock signal determined by a hold signal and a timing circuit configured to assert the hold signal based on multiple cycles of the parallel clock signal.

The disclosed embodiments can be realized as a method, an integrated circuit, a data processing system, and/or a design structure.

DETAILED DESCRIPTION

Figure 1:
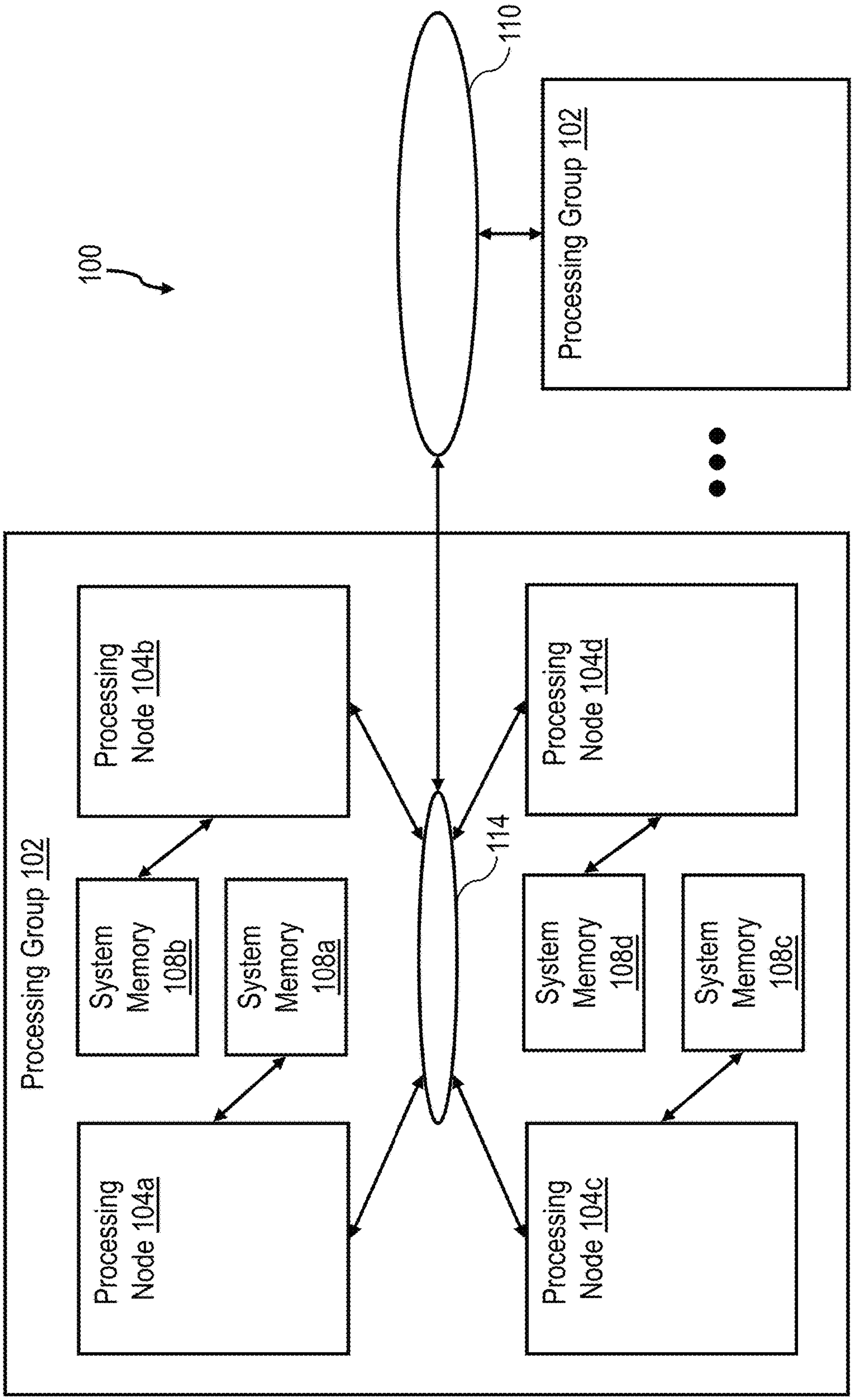
FIG. 1 is a high-level block diagram of an exemplary data processing system in accordance with one or more embodiments.

With reference now to the figures, wherein like reference numerals refer to like and corresponding parts throughout, and in particular with reference to FIG. 1, there is illustrated a high-level block diagram depicting an exemplary data processing system 100 in accordance with one or more embodiments. In the depicted example, data processing system 100 is a cache-coherent symmetric multiprocessor (SMP) data processing system including multiple processing nodes 104 for processing data and instructions. Each processing node 104 can be realized, for example, as a multi-chip module (MCM), as a set of chiplets on an interconnect substrate, or as a respective integrated circuit.

As further illustrated in FIG. 1, multiple processing nodes 104 can be coupled for communication to each other by a local interconnect 114, which may be implemented, for example, as a bused interconnect, a switched interconnect, or a hybrid interconnect. The local interconnects 114 of multiple processing groups 102 can, in turn, be coupled to a system interconnect 110, which, like local interconnect 114, may be implemented as a bused interconnect, a switched interconnect, or a hybrid interconnect. Local interconnects 114 and system interconnect 110 together form a system fabric for conveying address, data, and control information between processing nodes 104.

As described below in greater detail with reference to FIG. 2, processing nodes 104 each include a memory controller 106 coupled to local interconnect 114 to provide an interface to a respective system memory 108. Data and instructions residing in system memories 108 can generally be accessed, cached and modified by a processor core in any processing node 104 within data processing system 100. System memories 108 thus form the lowest level of memory storage in the distributed shared memory system of data processing system 100. In alternative embodiments, one or more memory controllers 106 (and system memories 108) can be coupled to system interconnect 110 rather than a local interconnect 114.

Those skilled in the art will appreciate that SMP data processing system 100 of FIG. 1 can include many additional non-illustrated components, such as interconnect bridges, non-volatile storage, ports for connection to networks or attached devices, etc. Because such additional components are not necessary for an understanding of the described embodiments, they are not illustrated in FIG. 1 or discussed further herein. It should also be understood, however, that the enhancements described herein are applicable to data processing systems of diverse architectures and are in no way limited to the generalized data processing system architecture illustrated in FIG. 1.

Figure 2:
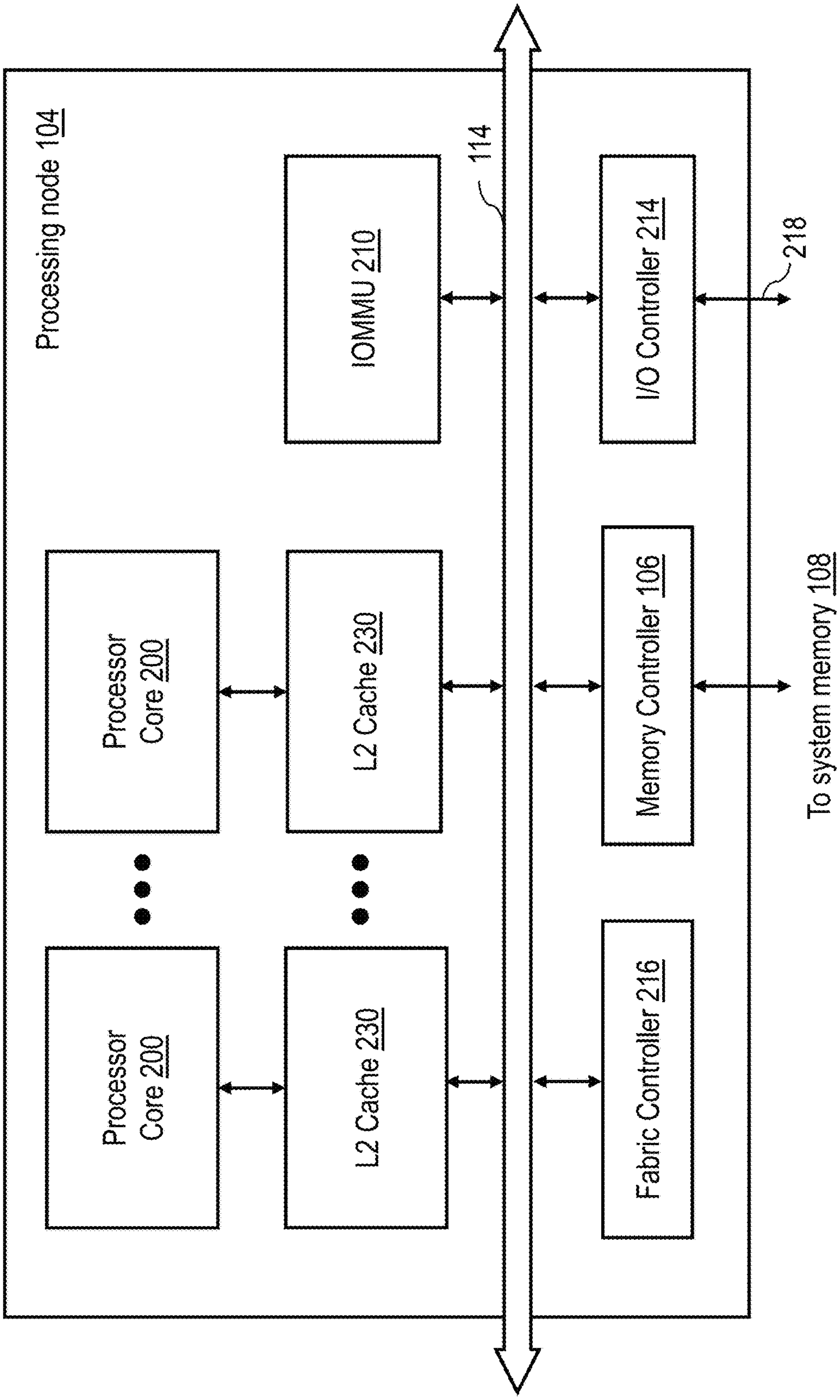
FIG. 2 is a more detailed block diagram of an exemplary processing node in accordance with one or more embodiments.

Referring now to FIG. 2, there is depicted a more detailed block diagram of an exemplary processing node 104 in accordance with one or more embodiments. In the depicted example, each processing node 104 is an integrated circuit including one or more processor cores 200 for processing instructions and data.

The operation of each processor core 200 is supported by a multi-level memory hierarchy having at its lowest level a shared system memory 108 accessed via an integrated memory controller 106. At its upper levels, the multi-level memory hierarchy includes one or more levels of cache memory, which in the illustrative example include a level one (L1) cache within and private to each processor core 200, and a respective level two (L2) cache 230 for each processor core 200. Although the illustrated cache hierarchies includes only two levels of cache, those skilled in the art will appreciate that alternative embodiments may include additional levels (L3, L4, etc.) of on-chip or off-chip, private or shared, in-line or lookaside cache, which may be fully inclusive, partially inclusive, or non-inclusive of the contents the upper levels of cache.

Each processing node 104 further includes an integrated and distributed fabric controller 216 responsible for controlling the flow of operations on the system fabric comprising local interconnect 114 and system interconnect 110 and for implementing the coherency communication required to implement the selected cache coherency protocol. Processing node 104 further includes an integrated I/O (input/output) controller 214 supporting the attachment of one or more I/O devices (not depicted) via an I/O interconnect 218. Processing node 104 also includes an I/O memory management unit (IOMMU) 210 that provides effective-to-real address translations for I/O devices coupled to I/O controller 214.

Figure 3:
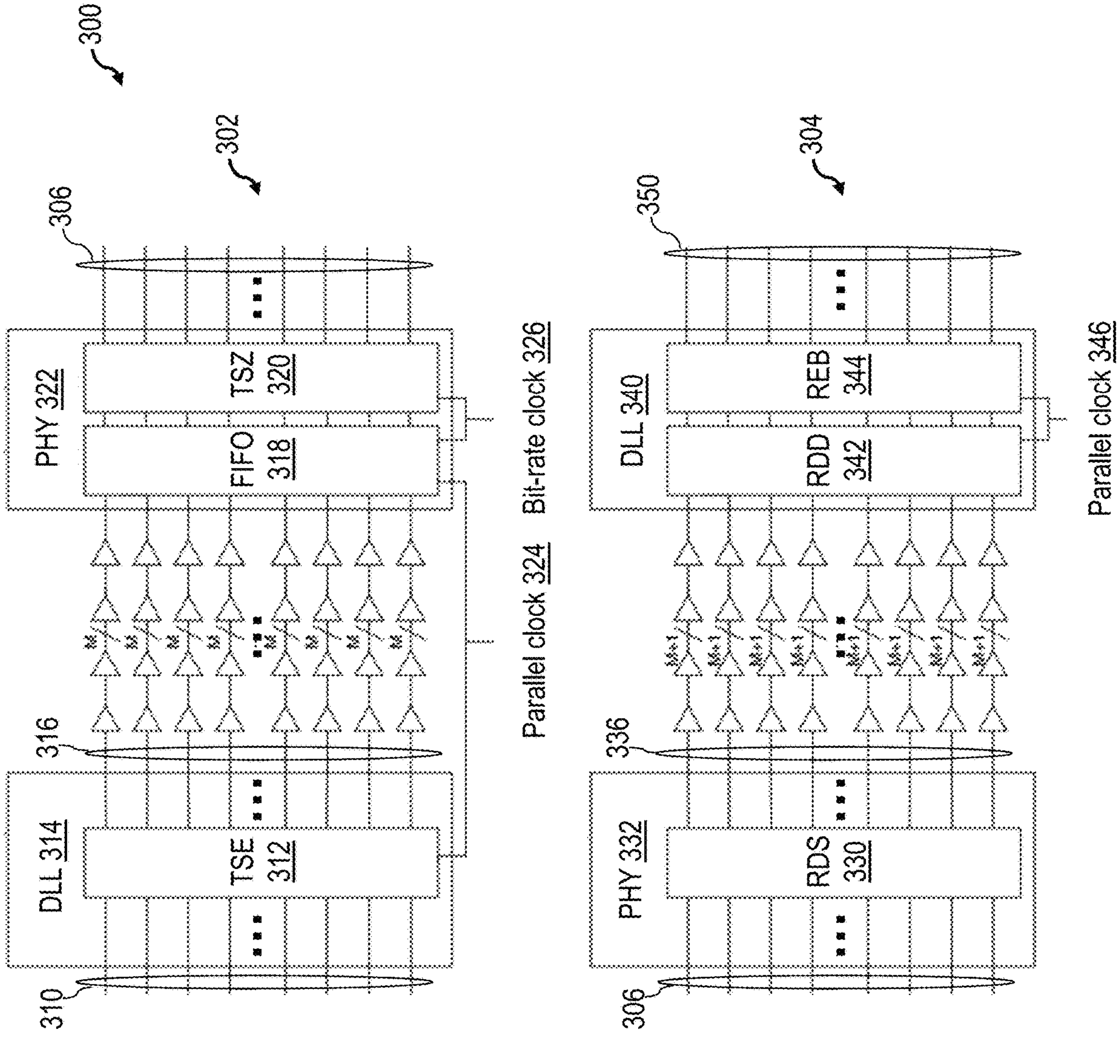
FIG. 3 is a block diagram of a data link in accordance with one or more embodiments.

With reference now to FIG. 3, there is illustrated a block diagram of an exemplary data link 300 in accordance with one or more embodiments. A data link 300 as shown in FIG. 3 can be utilized to implement one or more of system interconnect 110, local interconnect 114, or I/O interconnect 216 from FIGS. 1 and 2. Data link 300 includes a transmit side 302 and a receive side 304 coupled by a serial pin interface 306.

Referring specifically to transmit side 302, a transmit scrambler/encoder (TSE) 312 implementing a data link layer (DLL) 314 receives, on parallel interface 310, parallel transmit data from a transaction layer of the relevant communication protocol. TSE 312 then applies a selected scramble pattern, and optionally, an encoding, to the transmit data. TSE 312 then sequences the scrambled (and possibly encoded) transmit data via N lanes 316 of M-bit data to a physical layer (PHY) 322 including a M×N transmit first-in, first-out (FIFO) buffer 318 and transmit serializer (TSZ) 320. In this case, both M and N are positive integers greater than one. As indicated, the transmission of parallel data from TSE 312 to FIFO buffer 318 via lanes 316 is timed by reference to a parallel clock 324. Transmit data received by FIFO buffer 318 from lanes 316 are serialized M:1 by transmit serializer 320 and transmitted via serial pin interface 306 over data link 300 to receive side 304. The transmission of data from FIFO buffer 318 to transmit serializer 320 and by transmit serializer 320 on serial pin interface 306 is timed by reference to a bit-rate (or serial) clock 326.

On receive side 304, in-bound serial data on serial pin interface 306 is received by a receive deserializer (RDS) 330 forming the physical layer (PHY) 332 of receive side 304. In response to receiving the receive data, RDS 330 recovers the clock signal of bit-rate clock 326 from the receive data and deserializes the receive data. RDS 330 then transmits to DLL 340, via each of N parallel lanes 336, M+1 bits, including M data bits and the recovered clock signal. DLL 340 includes a receive descrambler/decoder (RDD) 342 and a receive elastic buffer (REB) 344, which are timed by a parallel clock 346. RDD 342 decodes and descrambles the parallel receive data and passes the decoded and descrambled receive data to REB 344, which forwards the parallel receive data to the transaction layer of receive side 304 via parallel interface 350.

Figure 4:
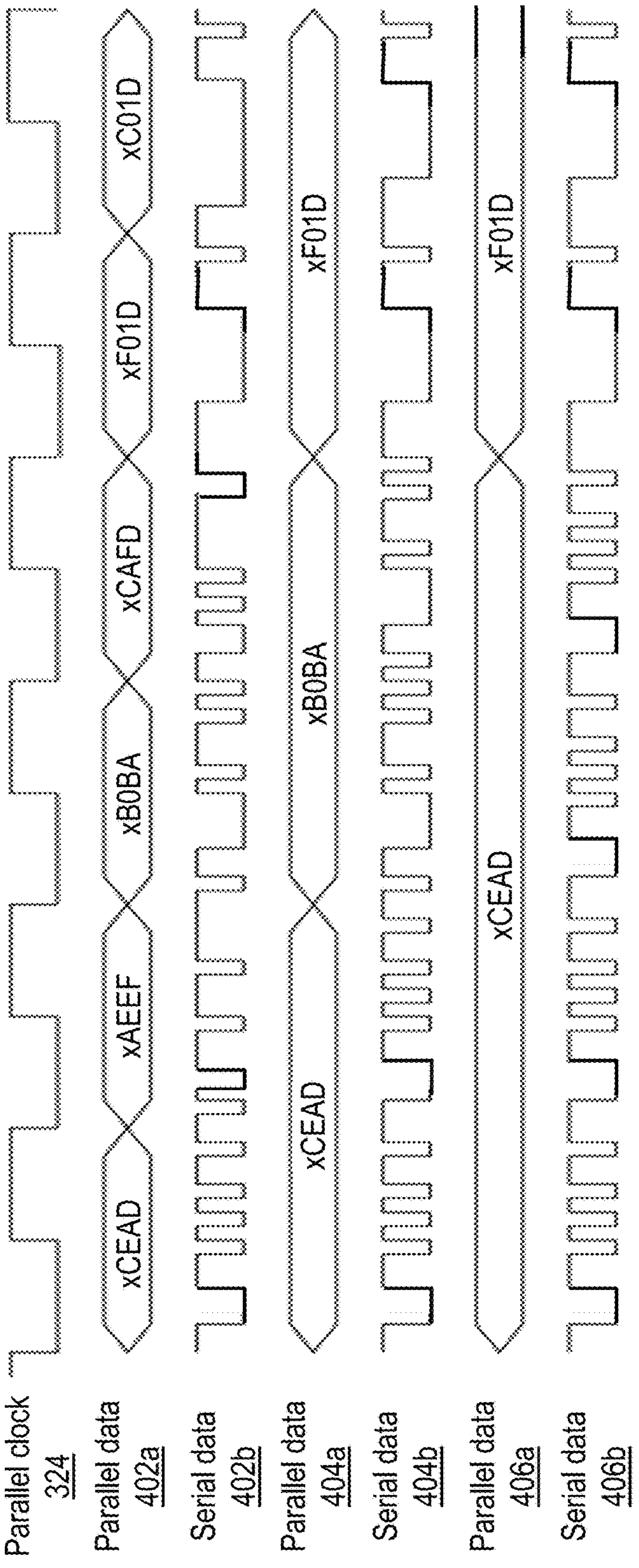
FIG. 4 is a waveform diagram of exemplary data link layer low density scramble patterns in accordance with one or more embodiments.

Referring now to FIG. 4, there is depicted a waveform diagram of exemplary data link layer (DLL) low density scramble patterns in accordance with one or more embodiments. In this example, switching power dissipated in the parallel clock domain of receive side 304 of data link 300 is advantageously reduced by DLL 314 capturing and holding each word of the applied scramble pattern for multiple cycles of parallel clock 324. It should be noted, however, that the switching rate and characteristics in the serial domain of PHY 322 remain unchanged.

For example, consider an original scramble pattern including the following sequence of six data words:

xCEAD=b1100_1110_1010_1101
xAEEF=b1010_1110_1110_1111
xB0BA=b1011_0000_1011_1010
xCAFD=b1100_1010_1111_1101
xF01D=b1111_0000_0001_1101
xC01D=b1100_0000_0001_1101

Assuming raw data of b'00 . . . 00', application of this scramble pattern to the raw data by TSE 312 would yield parallel data 402*a* and associated serial data 402*b*.

In accordance with the disclosed embodiments, power dissipation in the parallel clock domain of receive side 304 (RDS 330, parallel lanes 336, and RDD 342) can be reduced by holding or extending the scramble pattern for a selected positive integer number of cycles H of parallel clock 324. In at least some embodiments, H is chosen to be a positive integer power of 2, such as H=2, 4, 8, 16, . . . , etc. For example, in cases in which H=2, the first, third, and fifth data words of the scramble pattern are repeated for two cycles of parallel clock 324 rather than for one cycle, as seen in parallel data pattern 404*a*. Similarly, in cases in which H=4, the first and fifth data words of the scramble pattern are repeated for four cycles rather than one cycle, as seen in parallel data pattern 406*a*. Thus, each scramble pattern in which a data word is held for greater than one cycle of parallel clock 324 has the same general characteristics as the original scramble pattern. If the original scramble pattern of order P has $2^P-1$ cycles in the scrambling sequence, the extended scramble pattern obtained by holding each word of the original scramble pattern for H cycles has $H*(2^P-1)$ cycles in the extended scrambling sequence.

In some embodiments, data are communicated over a data link 300 utilizing a communication protocol that implements a block encoding scheme that includes synchronizing header bits to identify the beginning of each data block. For example, common block encoding schemes include a 64b/66b encoding scheme that employs a two-bit header for each 64 bits of data and a 128b/130b encoding scheme that implements a two-bit header for each 128 bits of data. For larger values of H, the inclusion of synchronizing header bits can cause undesirable switching between blocks. To reduce this effect, bits of the scramble pattern are preferably skipped to accommodate the synchronizing header bits so that alignment of the scramble pattern with the serializer/deserializer (SERDES) width is maintained.

For example, consider the foregoing scramble pattern in which the first data word is:

XCEAD=B1100_1110_1010_1101

Figure 5:
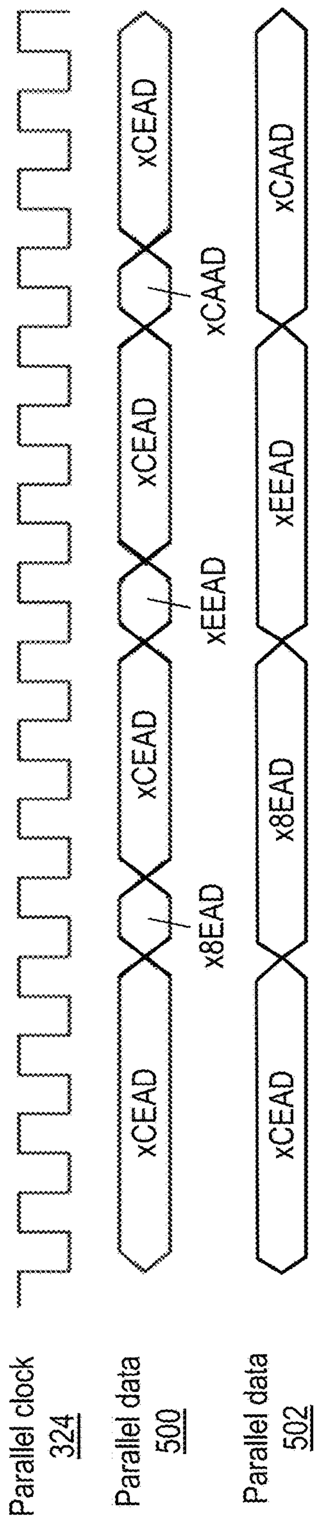
FIG. 5 is a waveform of an exemplary data link layer low density scramble pattern for encoded data in accordance with one embodiment.

Assuming a 64b/66b encoding scheme and selection of H to be 16 (which means each 16-bit data word of the scramble pattern is repeated four times), the scramble pattern would be misaligned with the SERDES width if the synchronizing header bits were simply appended to the 64-bit scramble pattern. Consequently, to maintain alignment of the scramble pattern with the SERDES width, one possible non-preferred solution would be to simply replace bits of the extended scramble pattern with the synchronizing header bits. Thus, for example, assuming a 2-bit synchronizing header of b'10', a 16-cycle scramble pattern could be changed from xCEAD, xCEAD, xCEAD, xCEAD to the 16-cycle scramble pattern shown in FIG. 5 as parallel data 500. In parallel data 500, the extended scramble pattern for the first set of four cycles (corresponding to the length of the encoded block) is xCEAD, the extended scramble pattern for the second set of four cycles is x8EAD (i.e., b1000_1110_1010_1101) followed by three cycles of xCEAD, the extended scramble pattern for the third set of four cycles is xEEAD (i.e., b1110_1110_1010_1101) followed by three cycles of xCEAD, and the extended scramble pattern for the fourth set of four cycles is xCAAD (i.e., b1100_1010_1010_1101) followed by three cycles of xCEAD. Although the alignment of the extended scramble pattern with the SERDES width is maintained in parallel data 500, the illustrated replacement of bits of the extended scramble pattern with synchronizing header bits undesirably leads to increased switching in the scramble pattern, in this case, six times over the 16 cycles.

However, in accordance with some preferred embodiments, switching of an extended scramble pattern including synchronizing header bits can be reduced. For example, as shown in parallel data 502 of FIG. 5, an improved solution can reduce switching in the extended scramble pattern by retaining the extended scramble pattern as modified by the synchronizing header bits for the duration of each encoded block. Thus, again assuming that H=16 and the original scramble word is xCEAD, the extended scramble pattern reflected to parallel data 502 includes xCEAD for the first set of four cycles, x8EAD for the second set of four cycles, xEEAD for the third set of four cycles, and xCAAD for the fourth set of four cycles. As a consequence, the number of switches in the extended scramble pattern over 16 cycles is reduced from six to three.

Figure 6:
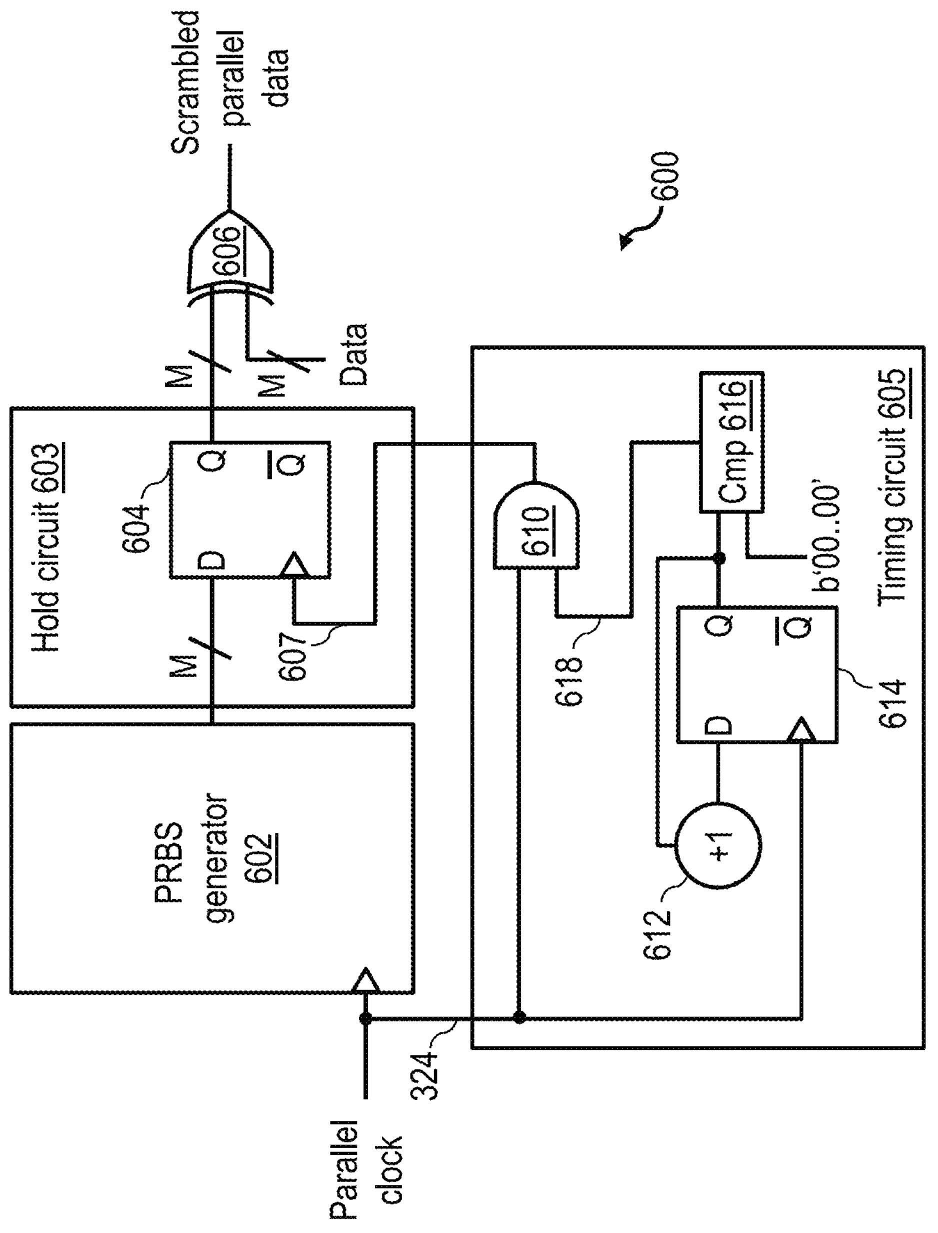
FIG. 6 is a diagram of an exemplary data scrambling circuit in accordance with one or more embodiments.

Referring now to FIG. 6, there is depicted a diagram of an exemplary data scrambling circuit 600 in accordance with one or more embodiments. Data scrambling circuit 600 may be implemented, for example, in TSE 312 for each of the N M-bit lanes of data link 300, in order to generate low-density scramble patterns 404*a*, 406*a*, or 500 as described above.

In the illustrated example, data scrambling circuit 600 includes a pseudo-random bit sequence (PRBS) generator 602 of order P, where $2^P-1$ is the bit length of an original scramble pattern (e.g., 64 bits). PRBS generator 602, which can be implemented in at least some embodiments with a linear feedback shift register (LFSR) circuit, outputs M bits of the scramble pattern per cycle of parallel clock 324. The M bits of the original scramble pattern output by PRBS generator 602 are latched and held by a hold circuit 603. In the illustrated example, hold circuit 603 is implemented by a M-bit wide flip-flop 604. In this example, the M bits of the scramble pattern received from PRBS generator 602 by hold circuit 603 are latched a data input (D) of flip-flop 604 in response to a first transition of a hold signal 607 coupled to at the clock input of flip-flop 604. The M bits are held by flip-flop 604 and thereafter output from hold circuit 603 at the Q output of flip-flop 604 in response to a second transition of hold signal 607.

In the depicted embodiment, data scrambling circuit 600 additionally includes a timing circuit 605 that generates hold signal 607 based on parallel clock signal 324. In this example, timing circuit 605 includes a second flip-flop 614 having a width of $\log_2$ H bits, where H again represents a positive integer number of cycles of parallel clock 324 that each data word of the original scramble pattern generated by PRBS generator 602 is to be held. Those skilled in the art will appreciate that other implementations of timing circuit 605 can be used to generate a hold signal 607 of any desired period. Flip-flop 614, which functions as a counter, is coupled in feedback relation with an incrementer 612 that increments the count value maintained by flip-flop 614 in response to each cycle of parallel clock 324. A comparator 616 coupled to the Q output of flip-flop 614 compares the count value maintained by flip-flop 614 with a binary zero value and signals a counter overflow by asserting overflow signal 618. An AND gate 610 logically combines overflow signal 618 with parallel clock signal 324 to generate the hold signal 607 that clocks flip-flop 604.

The M-bit extended scramble pattern output by flip-flop 604 is logically combined with a sequence of M-bit data to be transmitted over data link 300, for example, by XOR gate 606, to obtain scrambled parallel data. As noted above, in some embodiments, data scrambling circuit 600 may be further augmented to insert synchronizing header bits to achieve a desired encoding scheme (e.g., b64/b66 or b128/b130), as is known in the art.

Figure 7:
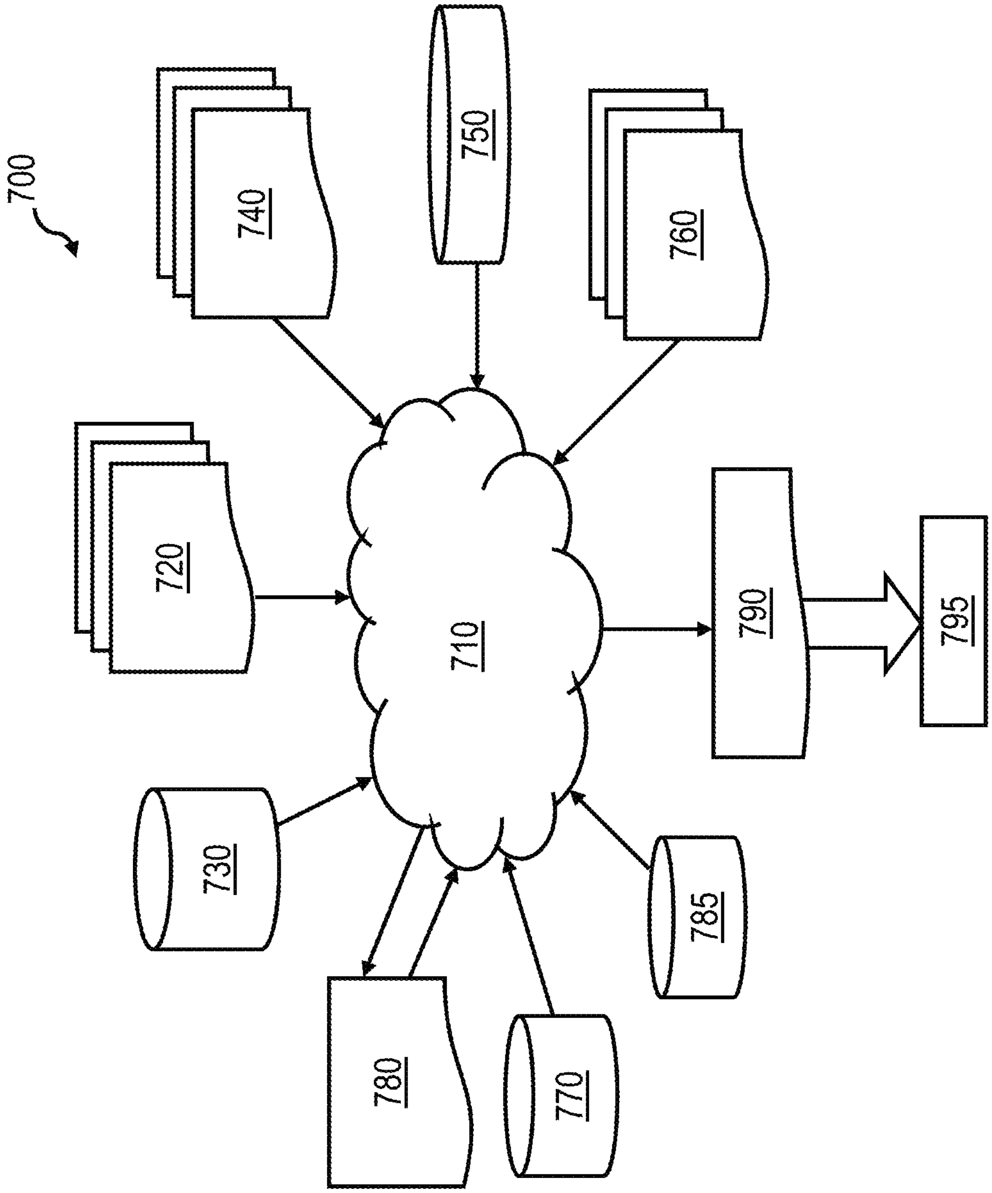
FIG. 7 is a data flow diagram illustrating a design process.

With reference now to FIG. 7, there is depicted a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of the design structures and/or devices described above. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown herein. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown herein to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 10 nm, 20 nm, 30 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 790 may comprise a compiled, executable HDL simulation model that functionally simulates one or more of the devices shown herein.

Design structure 790 may also employ a data format used for the exchange of layout data of integrated circuits and/or symbolic data format (e.g., information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 790 may then proceed to a stage 795 where, for example, design structure 790: proceeds to tape-out, is released to manufacturing, is released to a mask house, is sent to another design house, is sent back to the customer, etc.

As has been described, in at least one embodiment, a data link includes a transmit side having a physical layer circuit including a serial pin interface and a data link layer circuit coupled by one or more parallel multi-bit data lanes to the physical layer circuit. The data link layer circuit transfers parallel data to the physical layer circuit responsive to a parallel clock signal. The data link layer circuit includes a pseudo-random bit sequence generator circuit configured to generate, based on the parallel clock signal, a pseudo-random bit sequence having a width of M bits, where M is greater than 1. The data link layer circuit further includes a hold circuit coupled to receive and hold the pseudo-random bit sequence for a selected number of cycles of the parallel clock signal determined by a hold signal and a timing circuit configured to assert the hold signal based on multiple cycles of the parallel clock signal.

While various embodiments have been particularly shown and described, it will be understood by those skilled in the art that various changes in form and detail may be made therein without departing from the spirit and scope of the appended claims and these alternate implementations all fall within the scope of the appended claims. For example, although aspects have been described with respect to a computer system executing program code that directs the functions of the present invention, it should be understood that present invention may alternatively be implemented as a program product including a computer-readable storage device storing program code that can be processed by a processor of a data processing system to cause the data processing system to perform the described functions. The computer-readable storage device can include volatile or non-volatile memory, an optical or magnetic disk, or the like, but excludes non-statutory subject matter, such as propagating signals per se, transmission media per se, and forms of energy per se.

As an example, the program product may include data and/or instructions that when executed or otherwise processed on a data processing system generate a logically, structurally, or otherwise functionally equivalent representation (including a simulation model) of hardware components, circuits, devices, or systems disclosed herein. Such data and/or instructions may include hardware-description language (HDL) design entities or other data structures conforming to and/or compatible with lower-level HDL design languages such as Verilog and VHDL, and/or higher level design languages such as C or C++. Furthermore, the data and/or instructions may also employ a data format used for the exchange of layout data of integrated circuits and/or symbolic data format (e.g. information stored in a GDSII (GDS2), GL1, OASIS, map files, or any other suitable format for storing such design data structures).

What is claimed is:

1. A data link, comprising:
a transmit side including:
a physical layer circuit including a serial pin interface;
a data link layer circuit coupled by one or more parallel multi-bit data lanes to the physical layer circuit, wherein the data link layer circuit transfers parallel data to the physical layer circuit responsive to a parallel clock signal, and wherein the data link layer circuit includes a data scrambling circuit including:
a pseudo-random bit sequence generator circuit configured to generate, based on the parallel clock signal, a pseudo-random bit sequence having a width of M bits, wherein M is greater than 1;
a hold circuit coupled to receive and hold the pseudo-random bit sequence for a selected number of cycles of the parallel clock signal determined by a hold signal; and
a timing circuit configured to assert the hold signal based on multiple cycles of the parallel clock signal.

2. The data link of claim 1, wherein the data scrambling circuit includes:
a logic gate that logically combines the pseudo-random bit sequence and a sequence of M-bit data to be transmitted over the data link to obtain scrambled parallel data.

3. The data link of claim 1, wherein the data link layer circuit is further configured to encode data transmitted over the data link with synchronizing header bits.

4. The data link of claim 1, wherein the hold circuit includes a flip-flop.

5. The data link of claim 1, wherein:
the timing circuit includes a counter; and
the selected number of cycles is a positive integer power of two.

6. The data link of claim 1, wherein the data link comprises an interconnect of a data processing system.

7. A data processing system, comprising:
the data link according to claim 1; and
first and second integrated circuits communicatively coupled by the data link.

8. A design structure tangibly embodied in a machine-readable storage device for designing, manufacturing, or testing an integrated circuit, the design structure comprising:
a data link including a transmit side, the transmit side including:
a physical layer circuit including a serial pin interface;
a data link layer circuit coupled by one or more parallel multi-bit data lanes to the physical layer circuit, wherein the data link layer circuit transfers parallel data to the physical layer circuit responsive to a parallel clock signal, and wherein the data link layer circuit includes a data scrambling circuit including:
a pseudo-random bit sequence generator circuit configured to generate, based on the parallel clock signal, a pseudo-random bit sequence having a width of M bits, wherein M is greater than 1;
a hold circuit coupled to receive and hold the pseudo-random bit sequence for a selected number of cycles of the parallel clock signal determined by a hold signal; and
a timing circuit configured to assert the hold signal based on multiple cycles of the parallel clock signal.

9. The design structure of claim 8, wherein the data scrambling circuit includes:
a logic gate that logically combines the pseudo-random bit sequence and a sequence of M-bit data to be transmitted over the data link to obtain scrambled parallel data.

10. The design structure of claim 8, wherein the data link layer circuit is further configured to encode data transmitted over the data link with synchronizing header bits.

11. The design structure of claim 8, wherein the hold circuit includes a flip-flop.

12. The design structure of claim 8, wherein:
the timing circuit includes a counter; and
the selected number of cycles is a positive integer power of two.

13. The design structure of claim 8, wherein the data link comprises an interconnect of a data processing system.

14. A method of handling data at a transmit side of a data link, the method comprising:
at a data link layer circuit:
generating, based on a parallel clock signal, a pseudo-random bit sequence having a width of M bits, wherein M is greater than 1;
holding the pseudo-random bit sequence for a selected number of cycles of the parallel clock signal determined by a hold signal;
asserting, by a timing circuit, the hold signal based on multiple cycles of the parallel clock signal;
transferring data from the data link layer circuit to a physical layer circuit via one or more parallel multi-bit data lanes responsive to the parallel clock signal; and
transmitting the data, by the physical layer circuit, via a serial pin interface.

15. The method of claim 14, further comprising:
logically combining the pseudo-random bit sequence and a sequence of M-bit data to be transmitted over the data link to obtain scrambled parallel data.

16. The method of claim 14, further comprising encoding the data transmitted over the data link with synchronizing header bits.

17. The method of claim 14, wherein the holding includes holding the pseudo-random bit sequence in a flip-flop.

18. The method of claim 14, wherein the selected number of cycles is a positive integer power of two.

* * * * *